(12) United States Patent
Neidengard

(10) Patent No.: US 10,320,395 B2
(45) Date of Patent: Jun. 11, 2019

(54) CASCADED COUNTER CIRCUIT WITH PIPELINED RELOAD OF VARIABLE RATIO DETERMINED VALUES

(71) Applicant: Intel Corporation, Santa Clara, CA (US)

(72) Inventor: Mark Neidengard, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 136 days.

(21) Appl. No.: 15/414,408

(22) Filed: Jan. 24, 2017

(65) Prior Publication Data

US 2018/0212608 A1    Jul. 26, 2018

(51) Int. Cl.
| | | |
|---|---|---|
| *H03K 21/00* | (2006.01) | |
| *G06F 17/50* | (2006.01) | |
| *H03K 23/58* | (2006.01) | |
| *G09G 5/00* | (2006.01) | |

(52) U.S. Cl.
CPC ............. *H03K 23/588* (2013.01); *G09G 5/00* (2013.01); *G09G 2310/0264* (2013.01)

(58) Field of Classification Search
CPC ........ H03K 23/588; H03K 3/037; G06T 1/60; G09G 5/00; G09G 2310/0264
USPC ........................................................ 377/44
See application file for complete search history.

(56) References Cited

U.S. PATENT DOCUMENTS

| | | | | |
|---|---|---|---|---|
| 5,526,391 A | * | 6/1996 | Shankar ................. | H03K 21/10 377/118 |
| 6,501,816 B1 | * | 12/2002 | Kouznetsov .............. | G06F 7/68 327/115 |
| 6,931,354 B2 | * | 8/2005 | Jones ................... | G06F 11/3466 702/186 |
| 7,092,479 B1 | * | 8/2006 | Reid ...................... | H03K 21/16 377/28 |
| 7,405,631 B2 | | 7/2008 | Niedengard | |
| 7,667,507 B2 | | 2/2010 | Niedengard | |
| 7,679,404 B2 | | 3/2010 | Niedengard | |
| 8,644,447 B2 | * | 2/2014 | Prakash ............... | H03K 23/588 377/107 |
| 8,756,451 B2 | | 6/2014 | Niedengard et al. | |
| 9,190,991 B2 | | 11/2015 | Niedengard et al. | |
| 9,438,219 B2 | | 9/2016 | Krishnamurthy et al. | |
| 9,450,589 B2 | | 9/2016 | Feldman et al. | |
| 2007/0075753 A1 | | 4/2007 | Parker et al. | |
| 2016/0285436 A1 | | 9/2016 | Niedengard et al. | |

* cited by examiner

*Primary Examiner* — Dinh T Le

(74) *Attorney, Agent, or Firm* — Compass IP Law PC

(57) ABSTRACT

An apparatus is described. The apparatus includes a counter circuit having ordered state element circuits where a respective clock input of a state element circuit is fed by a data output of a preceding lower ordered bit state element. The counter circuit also being programmable to enable different amounts to be counted by the counter circuit, wherein respective reload values for the amounts are received at the state elements as a respective asynchronous set or reset.

20 Claims, 9 Drawing Sheets

CASCADED COUNTER CIRCUIT WITH PIPELINED RELOAD OF VARIABLE RATIO DETERMINED VALUES

FIELD OF INVENTION

The field of invention pertains generally to the electronic arts, and, more specifically, to a cascaded counter circuit with pipelined reload of variable ratio determined values.

BACKGROUND

With the emergence of battery operated or other power consumption sensitive systems, circuit designers of computing systems are looking for ways to reduce the power consumption of their respective circuits while, at the same time, maintaining high performance of their circuits.

FIGURES

A better understanding of the present invention can be obtained from the following detailed description in conjunction with the following drawings, in which:

FIGS. 1b and 1c show timing diagrams associated with the counter and clock division circuit of FIG. 1a;

DETAILED DESCRIPTION

As is known in the art, the power consumption of a digital circuit is proportional to the speed of the circuit's clock signals and the extent to which clock signals extend into the circuit. A traditional high performance counter circuit has a relatively large number of higher speed clock nodes which causes the circuit to consume a considerable amount of power.

Counters are used in many digital circuits. In particular, counters are used to create lower frequency clock signals from higher frequency clock signals. For example, a counter that is configured to count 8 clock cycles and then restart a next count of 8 clock cycles can be used to craft a clock having a frequency that $\frac{1}{16}^{th}$ the frequency of the counter's input clock (assuming the output clock toggles each time it counts out 8 clock cycles).

In the case of a traditional counter circuit, a separate state element circuit (e.g., a flip-flop) is used to hold each bit of the counter where each state element circuit has a clock input that receives the input clock to the overall counter. Upon each next clock tick, each state element will toggle its state or not toggle its state consistent with the correct next count value. However, with each state element receiving the input clock, each state element consumes considerable power.

Figure 1A:
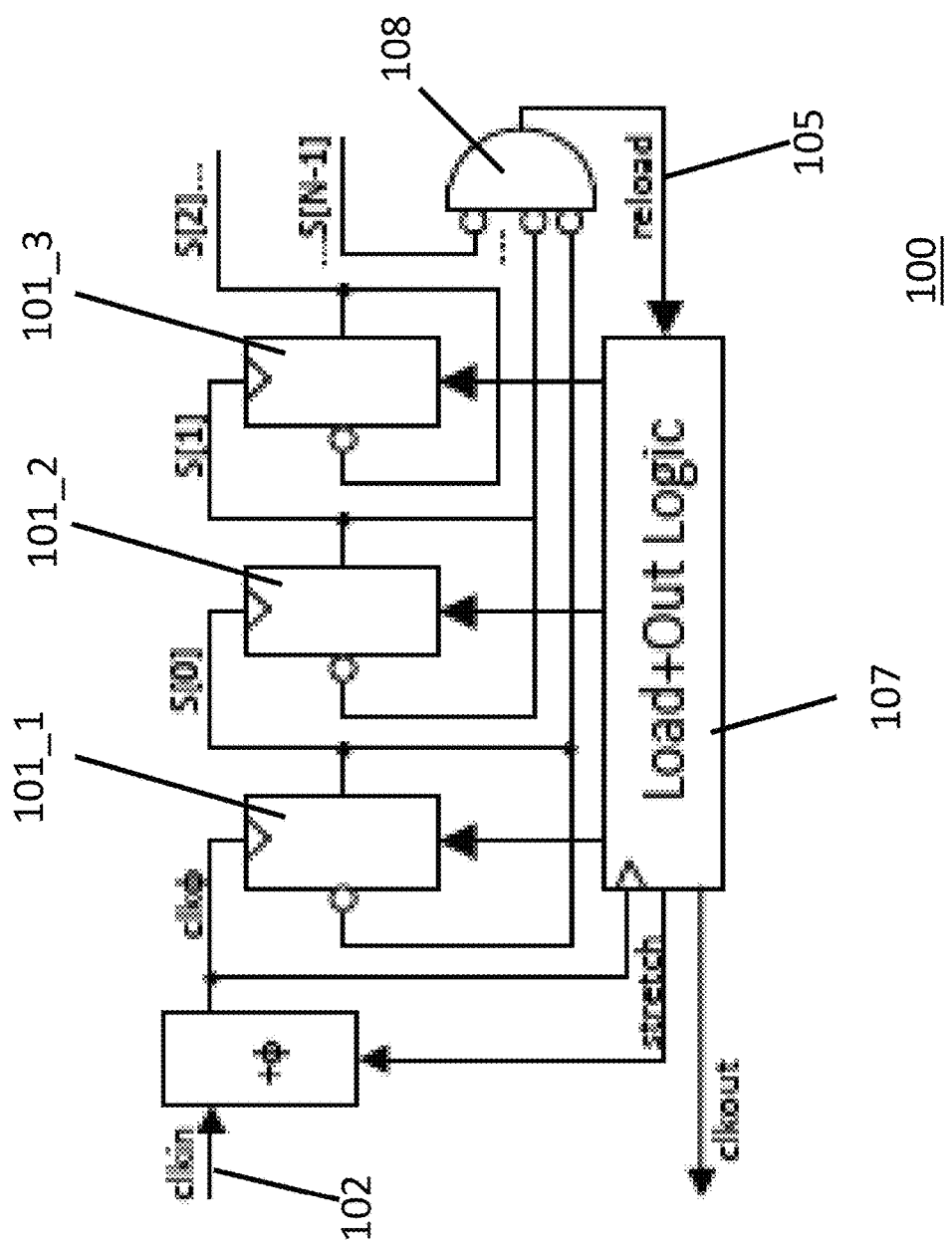
FIG. 1a shows a counter and clock division circuit.

FIG. 1a shows an improved counter circuit 100 that consumes less power than the traditional counter circuit described just above. As observed in FIG. 1a, rather than clock each state element 101_1, 101_2, 101_3 with the input clock clkin 102, Instead, only the state element 101_1 that keeps the lowest ordered bit of the count value S[0] is fed by the clkin input 102. Each successive state element, 101_2, 101_3 is then clocked by the output of the state element that keeps its immediately lower ordered bit.

For instance, in the particular 3 bit counter of FIG. 1a, the state element 101_2 that holds the second lowest ordered bit S[1} is clocked by the output of the state element 101_1 that keeps the lowest ordered S[0] bit, and, the state element 101_3 that holds the highest ordered bit S[2] is clocked by the output of the state element 101_2 that keeps the S[1] bit. Here, by clocking each state element with its immediately lower ordered bit, rather than clocking each state element with the input clock clkin 102, the power consumption of the counter circuit as a whole is significantly reduced as compared to a traditional clock circuit.

Figure 1B:
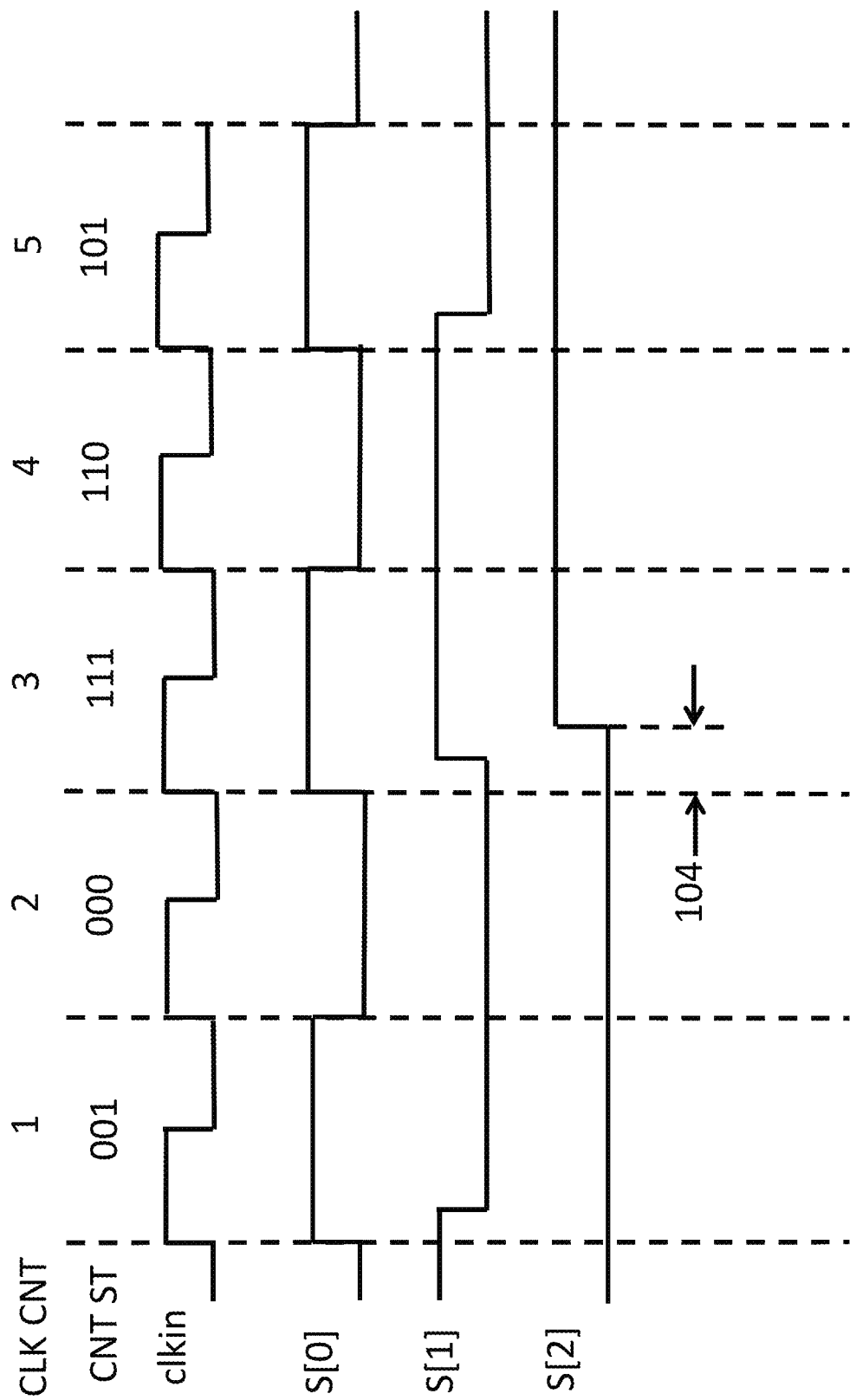

FIG. 1b demonstrates a timing problem that can arise with the improved counter circuit in the case of high input clock frequencies and/or wide counter values. FIG. 1b shows a timing diagram of the counter of FIG. 1a in the case where the counter is a three bit counter. Here, the counter is a divide by 16 counter that initially loads to a state of 111 and then counts down by one bit with each next clkin clock cycle until a counter value of 000 is reached, in which case, upon the next clkin clock cycle, the counter is reloaded with a value of 111 and the process repeats. FIG. 1b focuses upon the operation of the circuit a few clkin cycles prior to the 000→111 transition (which occurs from cycle 2 to cycle 3) and a few clkin cycles after the 000→111 transition.

As can be seen in clock cycle 3, the triggering of each successive state element on its immediately lower ordered bit element's state has the effect of ""walking out"" the propagation delay 103 of the 111 reload. That is, a considerable propagation delay 103 is consumed from the moment the S[0} state of state element 101_1 toggles to the moment the S[2] state of state element 101_3 toggles. In cases where the clkin cycle time is very small (high clkin frequency) and/or the counter bit width is very large (e.g., 10 bits, 16 bits, etc.), the propagation delay 104 may exceed the clckin cycle time resulting in an inability to reload large binary values into the counter.

Figure 1C:
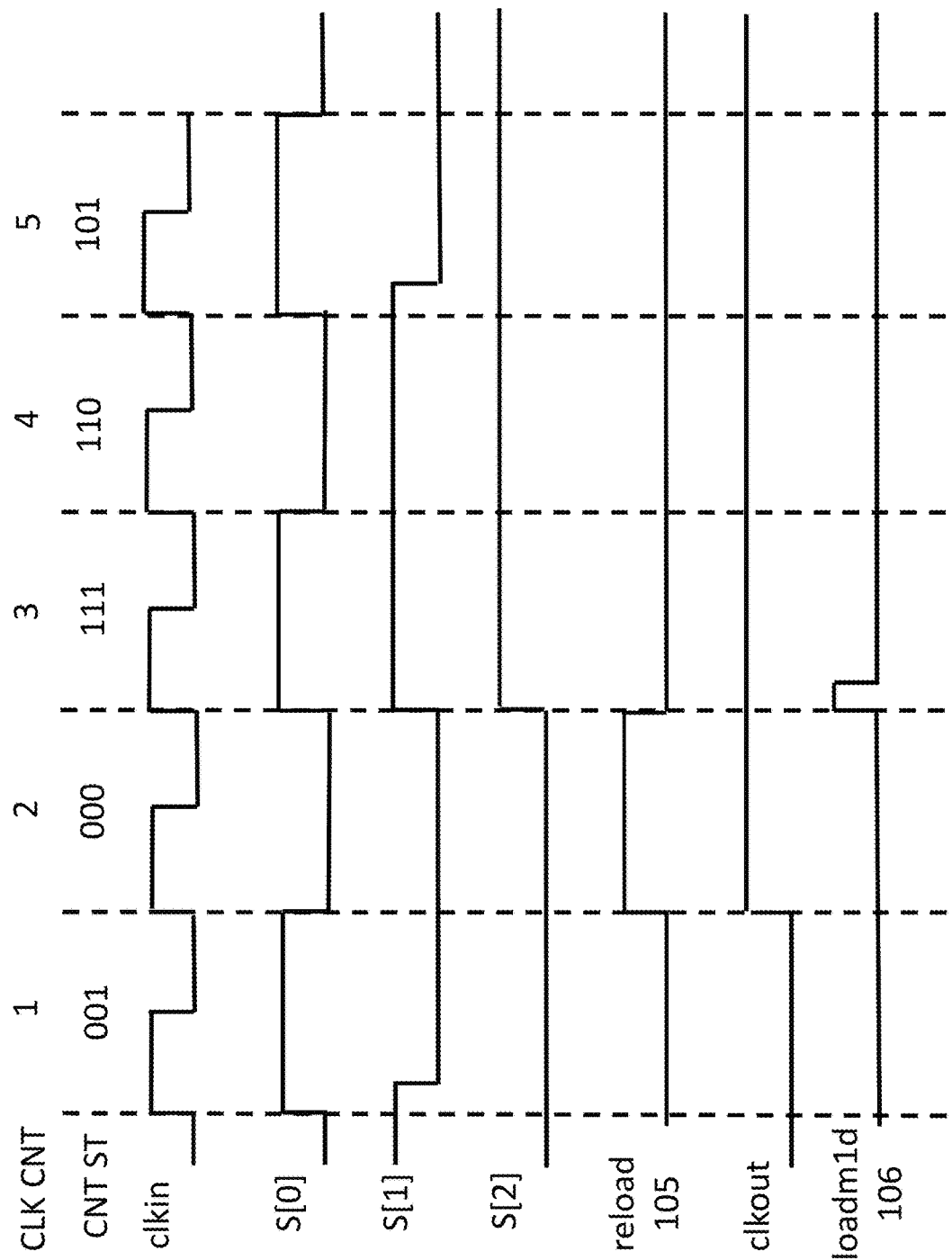

FIG. 1c shows the timing diagram of an alternative circuit design approach that avoids the propagation delay problem of FIG. 1b. In particular, as observed in FIG. 1c, upon the falling edge of the reload signal 105 at the beginning of cycle 3, which signifies that the counter needs to be reloaded to a value of 111, an asynchronous set signal loadm1d 106 is simultaneously applied to each of the state element circuits 101_1, 101_2, 101_3. As such, since the loadm1d signal 106 triggers in immediate response to the falling edge of the reload signal 105, as observed at the beginning of cycle 3, all three of the state element circuits 101_1, 101_2, 101_3 are set to a value of 1 immediately thereafter in response. The simultaneous or concurrent setting all three state elements avoids the aforementioned propagation delay problem.

In various embodiments, it is pertinent to note, that the counter circuit can be reloaded to different initial values. That is, repeatedly reloading a value of 111 corresponds to a divide by 16 counter. The counter, however, could just as easily be repeatedly reloaded with a value of 101 to form a divide by 12 counter, etc. Thus, upon a reload condition being reached, some state elements may be asynchronously set to a 1 whereas other state elements may be asynchronously set to a 0 so that the correct reload value can be reloaded into the counter. As such, the counter circuit of FIG. 1a includes load and output clock logic 107 where the load part of the logic 107 is designed to generate the aforementioned loadm1d signal 106. Additional, more specific features are discussed more thoroughly immediately below.

Figure 2:
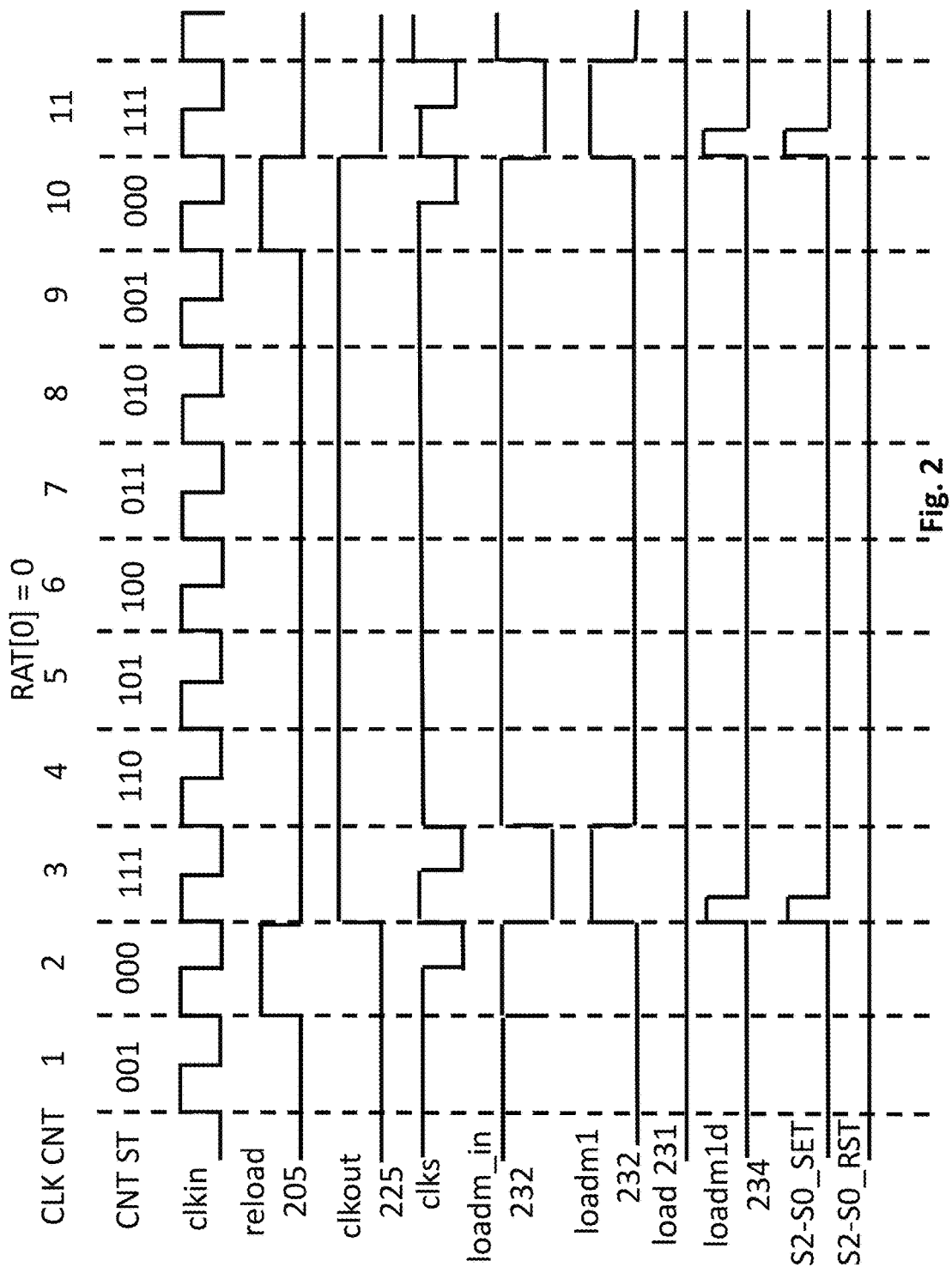
FIGS. 2 shows a timing diagram for even ratio division.
Figure 3A:
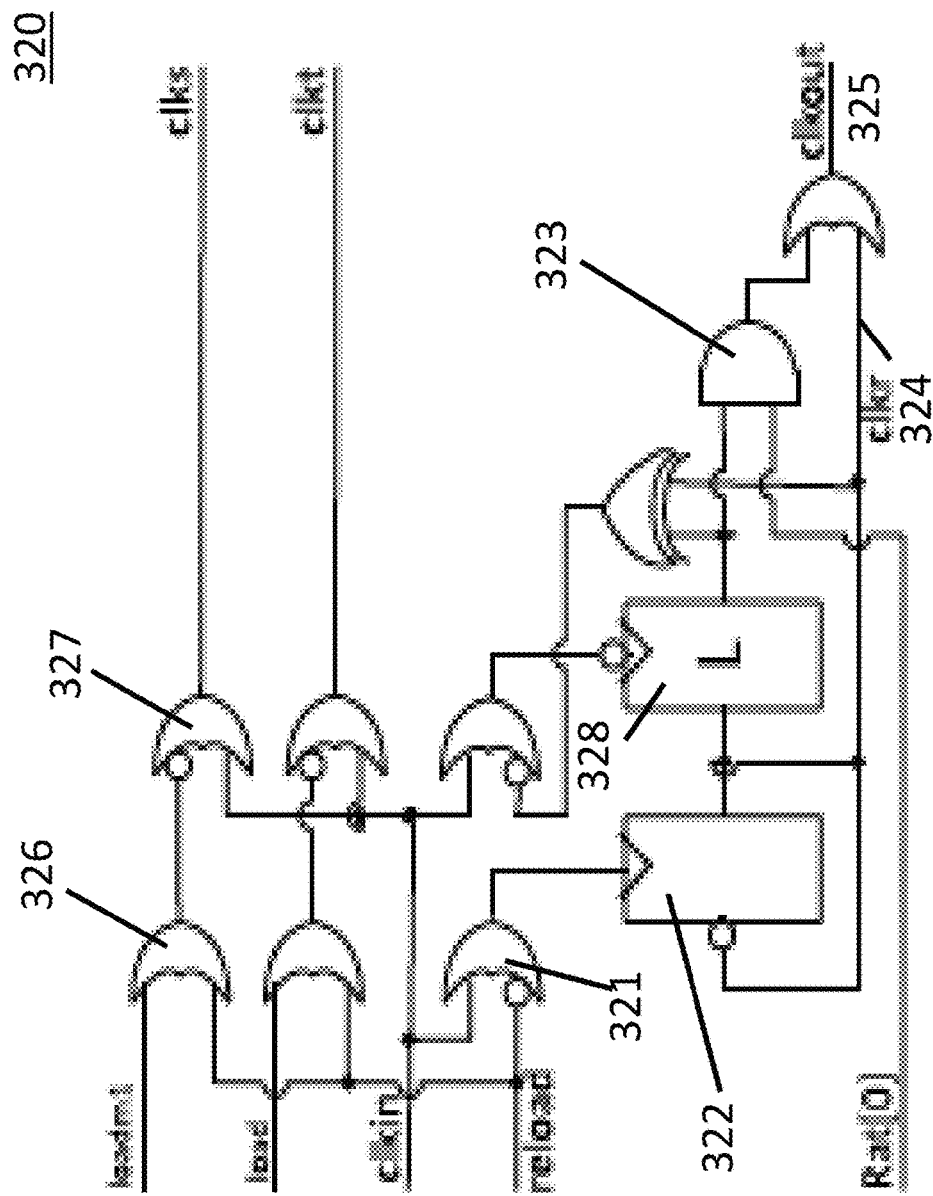
FIGS. 3a and 3b show detailed circuits for clock output and value loading.
Figure 3B:
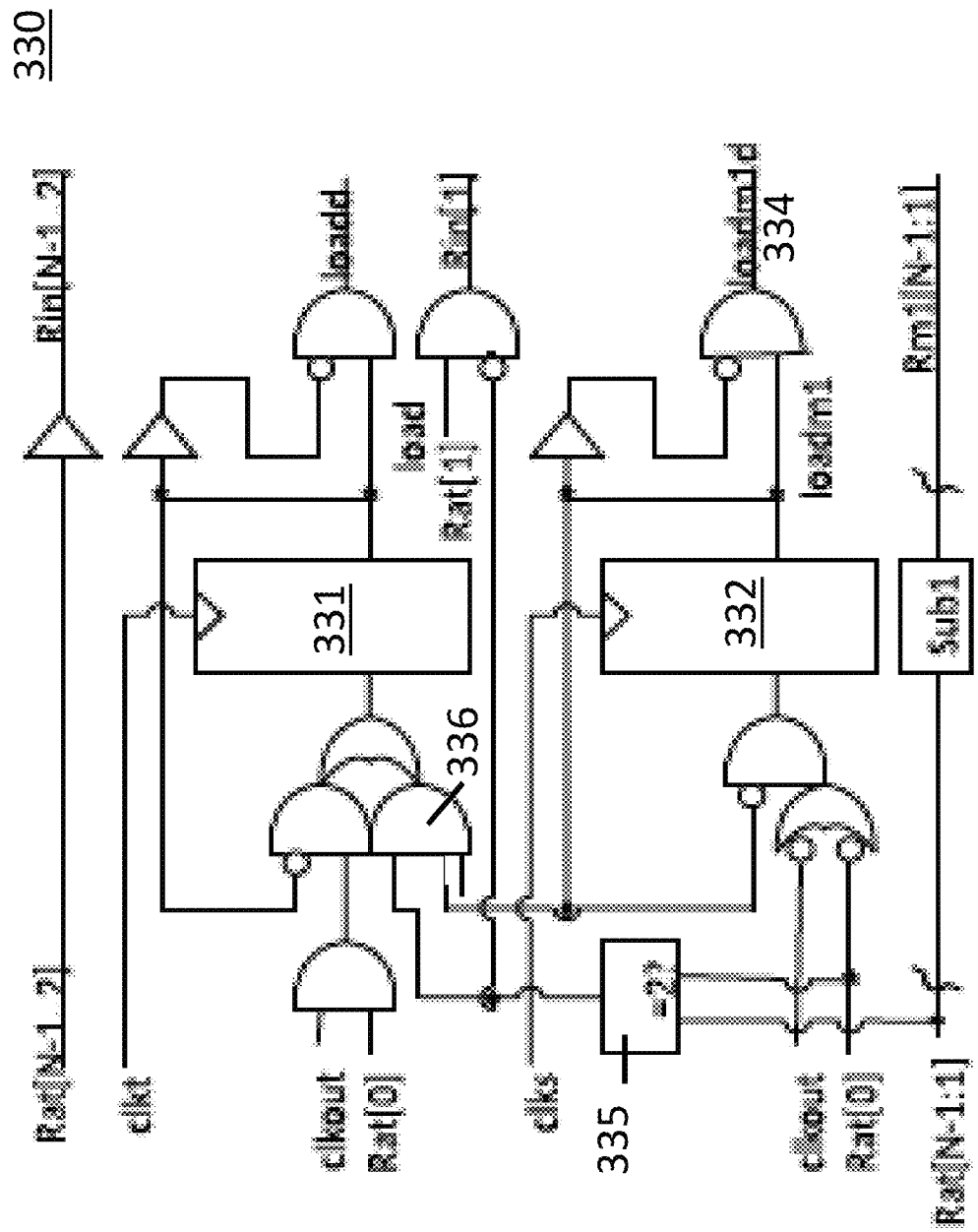
Figure 4:
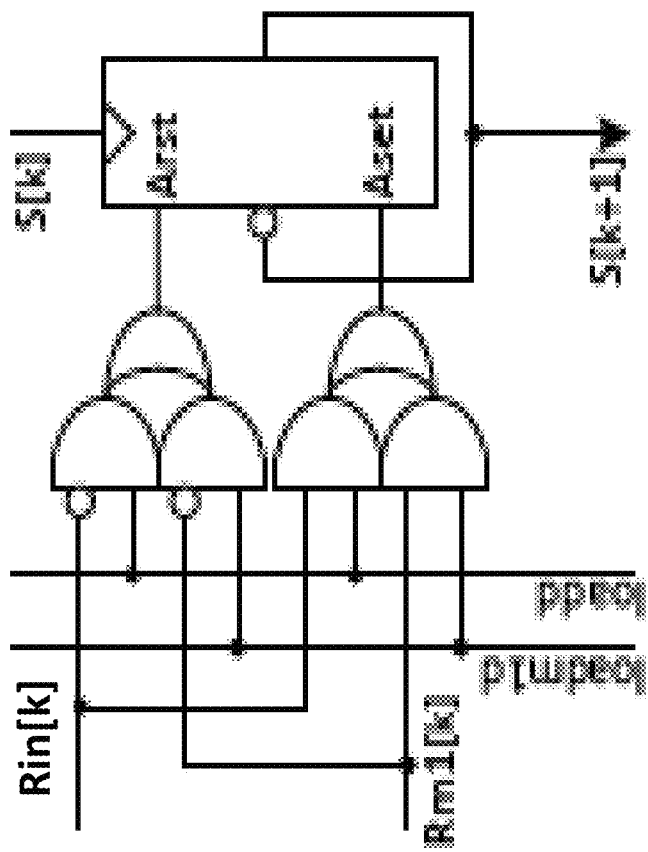
FIG. 4 shows a state element circuit.

FIG. 2 shows an embodiment of the operation of the counter circuit when it counts an even number of cycles. Here, an embodiment of counting an even number of cycles was referred to just above with respect to FIG. 1*c*. The timing diagram of FIG. 2, however, refers to the more detailed counter circuit details of FIGS. 3*a*, 3*b* and 4. Here, FIGS. 3*a* and 3*b* show different sections of the load and clock out circuitry 107 of FIG. 1*a*. Specifically, FIG. 3*a* shows the circuitry 320 that generates the output clock (clkout) while FIG. 3*b* shows the circuitry 330 that is responsible for generating the aforementioned asynchronous set/reset signals (such as the loadm1d signal 106). FIG. 4 shows a general instance of any of state element circuits 101_1, 101_2, 101_3 and its corresponding front end logic.

As mentioned above, the timing diagram of FIG. 2 corresponds to operation of the counter circuit when it counts an even number of cycles. As with the embodiment of FIG. 1*c*, the embodiment of FIG. 2 counts eight cycles from an initial state of 111 down to a final state of 000 and then repeats. Referring to FIGS. 1*a* and 2, when the counter state counts down to 000 in cycle 2, the reload signal 205 triggers to a HI state (for illustrative ease, FIG. 2 assumes zero propagation delay through all circuit components). Here, the reload signal 205 is provided by AND gate 108 of FIG. 1*a* which transitions to an output HI state only when the output of all three state elements 101_1, 101_2 and 101_3 is in a LO state (i.e., when S[2]=S[1]=S[0]=0).

Nominally then, during most of the clock cycles during a count down sequence, the input to OR gate 321 of FIG. 3*a* is a logic HI (because reload 205 is nominally LO) which clamps the output of OR gate 321 to a logic HI. When the counter state reaches 000, however, and the reload signal 205 transitions to a HI, OR gate 321 will pass its other input signal, clkin, to the clock input of flip-flop 322.

Here, a multi-bit "ratio" value, RAT, is programmed into the counter to define the divide down ratio of the output clock it is to produce (for simplicity the register that holds the RAT multi-bit value is not presented in the drawings). In the case where the divide down ratio corresponds to the counter counting by an even number of cycles, the lowest ordered bit of the ratio value RAT[0]=0. As such, in this case, the output of AND gate 323 is permanently clamped to a LO value and the output of flip-flop 322, clkr 324, corresponds to the divided down clock output, clkout 325.

As of the beginning of cycle 2, the output of flip-flop 322, clkr 324, is a logic LO. Thus, when the reload signal 205 transitions to a HI at the beginning of cycle 2 (which permits the clkin input to be received at the clock input of flip flop 322), the first edge that the flip-flop 322 will receive is the falling edge of clkin in the middle of cycle 2. The clock input of flip-flop 322 will next receive the rising edge of clkin at the beginning of cycle 3 which, in turn, causes the output state of flip-flop 322 to toggle to a HI. Thus, clockout 325 toggles to a HI at the beginning of cycle 3.

Additionally, when the reload signal 205 transitions to a logic HI at the beginning of cycle 2, the output of OR gate 326 transitions to a logic HI which frees the output of OR gate 327 to pass the clkin signal rather than be clamped HI. Here, nominally, that is during all cycles in which reload 206 is LO, load and loadm are also LO which clamps the output of OR gate 326 HI which in turn clamps the output of OR gate 327 HI. However, with neither clamping effect taking place when reload 205 is HI, the output of OR gate 327 essentially passes clkin at its output. The passed clock signal, referred to as clks, therefore transitions to a logic LO in the middle of cycle 2 and then transitions to a logic HI at the beginning of cycle 3.

As observed in FIG. 3*b*, the clkt and clks signals are used to respectively clock two latches 331, 332 that generate load 231 and loadm1 232 signals, respectively. As observed in FIG. 2 from these signals 231, 232, both of latches 331, 332 have a LO output as of the beginning of cycle 3. Moreover, note that with RAT[0]=0, the combinatorial logic that feeds input values to latch 331 is clamped to permanently provide a logic LO value to latch 331. As such the load signal 231 remains at logic LO through the circuit's operation.

By contrast, with RAT[0] and loadm1 being LO at the beginning of cycle 3, the input to flip flop 332, loadm_in 233, is HI at the beginning of cycle 3. As such, with receipt of the first rising edge of clks at the beginning of cycle 3, the output state of latch 332, loadm1 232, will toggle to a HI output state at the beginning of cycle 3. The toggling of the loadm1 output 232 of latch 332 to a logic HI causes the input logic that feeds latch 332 to toggle to a LO value (loadm_in 233 toggles LO). The current HI state of latch 332 causes OR gate 326 of FIG. 3*a* to feed a next clkin signal through OR gate 327, thus, a second rising edge of the clks signal is generated at the beginning of cycle 4. With the input to latch 332 being LO, the second rising edge of the clks signal at the beginning of cycle 4 causes latch 332 to toggle back to a logic LO at the beginning of cycle 4.

Returning back to cycle 3 operation, the toggling of the loadm1 output of latch 332 to a logic HI generates a single shot pulse loadm1d from the output 334 of the logic circuitry that follows the output of latch 332 in FIG. 3*b*. Referring to FIG. 4, the loadm1d pulse 234 is fed to each state element circuit. Here, the combinatorial logic that feeds each state element will cause the Aset input (asynchronous input) to each state element to receive a logic HI in response to the loadm1d pulse 234. The receipt of a HI at the asynch set input of each counter state element causes each counter state element to immediately transition to a HI as soon as the loadm1d pulse is received which causes each counter state element to transition to a HI approximately at the beginning of cycle 3 which corresponds to the desired reloading of the counter state to 111 for the next count down iteration.

With respect to the combinatorial logic of FIG. 4 that feeds the asynchronous set (Aset) and asynchronous reset (Arst) inputs to each counter state element. Note that the logic that generates these asynchronous inputs receives input values derived from the aforementioned multi-bit RAT value that defines the counter's output clock divide down frequency.

Here, in order to perform a specified clock division, e.g., RAT=10000 in order to perform a divide by 16 (which corresponds to the counter repeatedly counting eight cycles), the RAT value is first shifted to the right by one bit (e.g., 01000) and then a 1 is subtracted from the shifted value to determine the reload value (e.g., 01000−1=00111=rm1). Here, rm1[2] which corresponds to the rm1[k] input of FIG. 4 for the highest ordered counter state element S[2], is set to a value of 1. The same condition is true for the other rm1[k] inputs of the S[2] and S[1] counter state elements.

Note also that when RAT=10000, RAT[2]=RAT[1]=RAT[0]=0. Here, the RAT value is also shifted to the right by 1 and renamed again as Rin. That is, Rin=01000. Thus, the Rin[k] input of FIG. 4 is 0 for each of the three state element counter circuits S[2], S[1] and S[0]. Thus, in this particular example, where the three lowest ordered bits of Rin=000 and the three lowest ordered bits of rm1=111, Rin[k]=0 and rm1[k]=1 for all k=0, 1, 2. With the output (loadd) from the logic that follows the output of the load latch 331 being equal to 0, and the loadmd1 pulse 234 being received at the beginning of cycle 3, the asynch reset input is LO and the asnych set input is HI for all three counter state elements. Thus, again, all three state elements will transition to a logic HI, setting the overall counter state to 111 at the beginning of cycle 3. The counter then counts down until a counter state of 000 is again reached at cycle 10 as observed in FIG. 2 and the process repeats.

Figure 5:
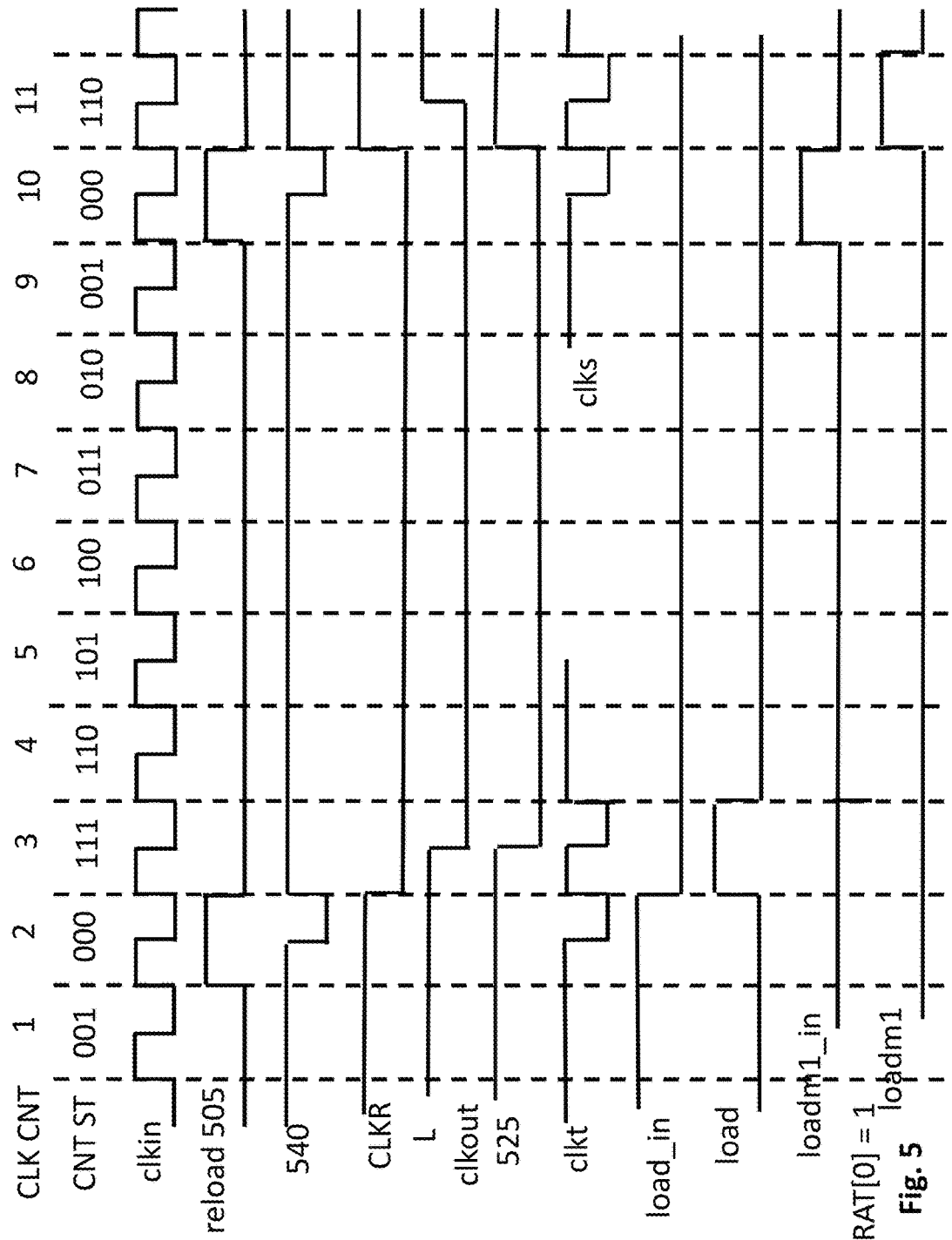
FIG. 5 shows a timing diagram for odd ratio division.

FIG. 5 shows operation of the circuit when it is programmed to count an odd number of clkin cycles. In the particular embodiment of FIG. 5, the circuit is programmed to perform a divide by 15 in which the counter circuit first counts out 8 cycles and then counts out 7 cycles and then repeats. As will be discussed more thoroughly below, unlike the even count operation discussed above with respect to FIG. 2, in which only the loadm1$d$ pulse from flip-flop 332 was activated, by contrast, with respect to the operation of the odd numbered count of FIG. 5, the loadm1$d$ and loadd pulses alternate to effect even and then odd number count sequences.

That is, referring to FIG. 5, note that the loadd pulse sets the counter to a value of 111 in cycle 3 but a loadm1$d$ pulse sets the counter to a value of 110 in cycle 11 (for ease of drawing the loadd and loadm1$d$ single shot outputs are not depicted in the timing diagram of FIG. 5 but they should be understood to exist directly from the load and loadm1 outputs of latches 331 and 332, respectively). In the case of a divide down by 15, RAT=01111; Rin=00111 and rm1=00110.

Here, as of cycle 2, when the counter reaches a value of 000 and the reload signal 505 transitions to a HI, the output of flip-flop 322 is a logic HI. As discussed above with respect to even count operation, when the reload signal 505 transitions to HI, a first clkin pulse is released to the input clock 540 of flip flop 322. As discussed above, a first rising edge of this clock input 540 occurs at the transition from cycle 2 to cycle 3 which causes the output of flip flop 322 to toggle to a LO state.

However, in the case of odd numbered count operation RAT[0]=1 such that the output L of the second following flip flop 328 can have an effect on the output clock (the output of AND gate 323 is not clamped LO). In particular, the circuitry that feeds the clock input of flip flop 328 causes the output L of flip flop 328 to toggle from a HI to a LO one half cycle later (in the middle of cycle 3). It is not until the output L of flip flop 328 toggles to a LO in the middle of cycle 3 that the clkout signal toggles from a HI to a LO.

Consistent with the description of even counter operation, first and second clkt rising edges appear at the cycle 2 to cycle 3 transition and the cycle 3 to cycle 4 transition. Thus, referring to FIGS. 3$b$ and 5, both of the load and loadm1 flip flops 331, 332 receive a first rising edge at their respective clock inputs at the cycle 2 to cycle 3 transition.

Referring to FIG. 3$b$, again with RAT[0]=1, and with clkout=HI and the load and loadm1 flip flop values=0 at the beginning of cycle 3, the logic that feeds input data to the load flip flop 331 will be HI at the beginning of cycle 3 while the logic that feeds data to the loadm1 flip flop 332 will be LO at the beginning of cycle 3.

As such the load flip flop 331 will transition to a logic HI at the beginning of cycle 3 and the loadm1 flip flop 332 will remain at logic LO at the beginning of cycle 3. With the load flip flop 331 toggling to logic HI, the input to the load flip flop 331 will toggle to a LO and, with the clkout toggling to HI at the beginning of cycle 3, the input to the loadm1 flip flop 332 will remain at a LO. As such, on the second rising edge of clkt at the transition from cycle 3 to cycle 4, the load flip flop 331 will toggle back to a logic LO. The loadm1 flip flop 332 will remain at logic LO because it does not receive second falling or second rising clks edges after the beginning of cycle 3 (unlike clkt).

The load pulse that is generated at cycle 3 causes a loadd single shot (not shown) to be directed to the counter latches. Referring to FIG. 3$c$, in the case where RAT[0]=1, loadd=HI and loadm1d=LO, the asynch set input to the state elements are loaded from the Rin[k] input if the Rin[k] input is high, which is true for all three of the S[2], S[1] and S[0] state elements in this example.

The counter then proceeds to count down until a value of 000 is reached at cycle 10. In this case, the counter reloads with a counter value of 110. Here, in the case where RAT[0]=1, loadd=LO and loadm1d=HI, the latches are set from the Rm1[k] input if the Rm1[k] input is HI and are reset if the Rm1[k] input is LO. In this example, S[2] and S[1] are set and S[0] is reset.

In the above examples, the output of the divide by 2 logic 335 was a logic LO because the counter was not dividing by 2 (it was dividing by 16 or 15). As such, the output of AND gate 336 was clamped LO and had no effect on the circuit. By contrast, if the counter is programmed to divide by 2, the output of logic 335 will be HI. To summarize the Ratio=2 operation, note that the loadm1 signal is HI and LO on alternating cycles from its self-limiting AND gate on loadm_in. The loaded state values are all zeroes, due to ((2>>1)–1)=0. Also, the "Ratio=2?" detector's output will be HI and Rat[0] will be LO, causing load_in to equal loadm. In short, load will trail loadm by one cycle, so that loadm and load will be opposite alternations of HI and LO.

Normally, one might expect this to cause the counter to load a 0001 on those cycles where loadd is HI. However, note that there is an added a layer of indirection between the input programmed Rat[ ] value and the counter load values, which come from Rin[ ]. Specifically, in Ratio=2 mode, Rin[1] is remapped to 0 to force the loaded value to 0000. Thus, whether in loadd or loadmd, the loaded counter value is always 0000 as required for correct operation.

Figure 6:
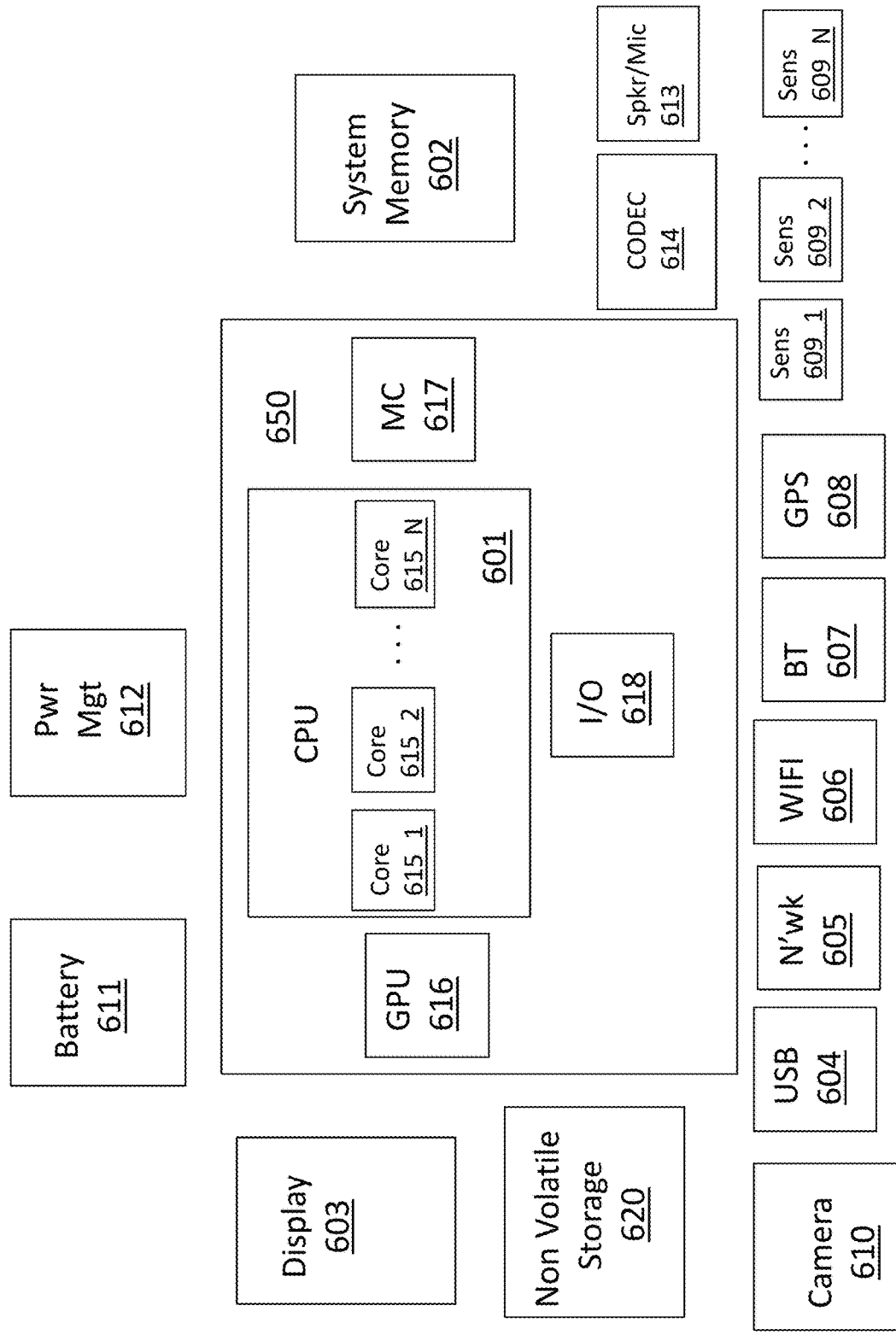
FIG. 6 shows a computing system.

FIG. 6 shows a depiction of an exemplary computing system 600 such as a personal computing system (e.g., desktop or laptop) or a mobile or handheld computing system such as a tablet device or smartphone, or, a larger computing system such as a server computing system. As observed in FIG. 6, the basic computing system may include a central processing unit 601 (which may include, e.g., a plurality of general purpose processing cores and a main memory controller disposed on an applications processor or multi-core processor), system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_N (e.g., one or more of a gyroscope, an accelerometer, a magnetometer, a temperature sensor, a pressure sensor, a humidity sensor, etc.), a camera 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing units 616 typically execute graphics intensive functions to, e.g., generate graphics information that is presented on the display 603. The memory control function 617 interfaces with the system memory 602. The system memory 602 may be a multi-level system memory having different caching structures in a faster level of system memory.

In various embodiments the divider described above may be integrated into the computing system. For example, the divider may be used in the feedback path of a phase locked loop circuit (e.g., to perform the frequency divide down of the output clock) or, e.g., any circuit that provides a divided down frequency clock from a higher frequency input clock (e.g., to drive a display, drive one or more circuits within a system on chip, etc.).

Each of the touchscreen display 603, the communication interfaces 604-607, the GPS interface 608, the sensors 609, the camera 610, and the speaker/microphone codec 613, 614 all can be viewed as various forms of I/O (input and/or output) relative to the overall computing system including, where appropriate, an integrated peripheral device as well (e.g., the camera 610). Depending on implementation, various ones of these I/O components may be integrated on the applications processor/multi-core processor 650 or may be located off the die or outside the package of the applications processor/multi-core processor 650. The mass storage of the computing system may be implemented with non volatile storage 620 which may be coupled to the I/O controller 618 (which may also be referred to as a peripheral control hub).

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of software or instruction programmed computer components or custom hardware components, such as application specific integrated circuits (ASIC), programmable logic devices (PLD), programmable logic arrays (PLAs), or field programmable gate array (FPGA).

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a counter circuit comprising ordered state element circuits where a respective clock input of a state element circuit is fed by a data output of a preceding lower ordered bit state element circuit, said counter circuit also being programmable to enable different values to be counted by said counter circuit, wherein respective reload values for said values are received at said state element circuits as a respective asynchronous set or reset, and wherein the ordered state element circuits toggle in phase along a same clock edge in response to a reload value that starts a next count sequence.

2. The apparatus of claim 1 wherein said state element circuits are preceded by respective logic circuits that receive a respective bit from a first value and respective bit from a second value, said first and second values derived from a divide down ratio.

3. The apparatus of claim 2 wherein said first value is said divide down ratio shifted to the right by one.

4. The apparatus of claim 3 wherein said second value is said divide down ratio shifted to the right by one and then subtracted by one.

5. The apparatus of claim 2 wherein said respective logic circuits also receive signals from first and second flip-flops, said first and second flip flops respectively to trigger reloading of different reload values into said counter for odd divide down ratios.

6. The apparatus of claim 5 wherein only one of said flip flops is used to trigger reloading of a same reload value for even divide down ratios.

7. The apparatus of claim 1 wherein said counter circuit provides a divided down clock having a 50-50 duty cycle.

8. An apparatus, comprising:
a counter circuit comprising ordered state element circuits where a respective clock input of a state element circuit is fed by a data output of a preceding lower ordered bit state element circuit, said counter circuit also being programmable to enable different values to be counted by said counter circuit, wherein respective reload values for said values are received at said state element circuits as a respective asynchronous set or reset, said counter having an input that receives an input clock and an output that provides an output clock having a divided down frequency of said input clock, and wherein the ordered state element circuits toggle in phase along a same clock edge in response to a reload value that starts a next count sequence.

9. The apparatus of claim 8 wherein said state element circuits are preceded by respective logic circuits that receive a respective bit from a first value and respective bit from a second value, said first and second values derived from a divide down ratio of said divided down frequency of said output clock.

10. The apparatus of claim 9 wherein said first value is said divide down ratio shifted to the right by one.

11. The apparatus of claim 10 wherein said second value is said divide down ratio shifted to the right by one and then subtracted by one.

12. The apparatus of claim 9 wherein said respective logic circuits also receive signals from first and second flip-flops, said first and second flip flops respectively to trigger reloading of different reload values into said counter for odd divide down ratios.

13. The apparatus of claim 12 wherein only one of said flip flops is used to trigger reloading of a same reload value for even divide down ratios.

14. The apparatus of claim 8 wherein said counter circuit provides a divided down clock having a 50-50 duty cycle.

15. A computing system, comprising:

a plurality of processing cores;

a memory controller, said memory controller coupled to a system memory;

a display;

a counter circuit to count a value within said computer system, said counter circuit comprising ordered state element circuits where a respective clock input of a state element circuit of the ordered state element circuits is fed by a data output of a preceding lower ordered bit state element of the ordered state element circuits, said counter circuit also being programmable to enable different values to be counted by said counter circuit, wherein respective reload values for said values are received at said state element circuits as a respective asynchronous set or reset, said counter having an input that receives an input clock and an output that provides an output clock having a divided down frequency of said input clock, and wherein the ordered state element circuits toggle in phase along a same clock edge in response to a reload value that starts a next count sequence.

16. The computing system of claim 15 wherein said state element circuits are preceded by respective logic circuits that receive a respective bit from a first value and respective bit from a second value, said first and second values derived from a divide down ratio of said divided down frequency of said output clock.

17. The computing system of claim 16 wherein said first value is said divide down ratio shifted to the right by one.

18. The computing system of claim 17 wherein said second value is said divide down ratio shifted to the right by one and then subtracted by one.

19. The computing system of claim 9 wherein said respective logic circuits also receive signals from first and second flip-flops, said first and second flip flops respectively to trigger reloading of different reload values into said counter for odd divide down ratios.

20. The computing system of claim 19 wherein only one of said flip flops is used to trigger reloading of a same reload value for even divide down ratios.

* * * * *